(12) United States Patent
Furuta et al.

(10) Patent No.: US 6,608,518 B2
(45) Date of Patent: Aug. 19, 2003

(54) SUPERCONDUCTING SINGLE FLUX QUANTUM CIRCUIT

(75) Inventors: Futoshi Furuta, Kokubunji (JP); Kazuo Saitoh, Kodaira (JP); Kazumasa Takagi, Hinode (JP)

(73) Assignee: Hitachi, Ltd., Tokoy (JP)

( * ) Notice: Subject to any disclaimer, the term of this patent is extended or adjusted under 35 U.S.C. 154(b) by 0 days.

(21) Appl. No.: 10/162,577

(22) Filed: Jun. 6, 2002

(65) Prior Publication Data
US 2003/0016069 A1 Jan. 23, 2003

(30) Foreign Application Priority Data
Jun. 15, 2001 (JP) ........................................ 2001-181556

(51) Int. Cl.[7] .............................................. H03K 17/92
(52) U.S. Cl. ........................................ 327/367; 327/528
(58) Field of Search ........................... 327/186, 366–371, 327/527–529; 326/1–7

(56) References Cited

U.S. PATENT DOCUMENTS 5,266,844 A * 11/1993 Ko et al. ...................... 327/19
5,552,735 A * 9/1996 Kang et al. .................. 327/367
5,818,373 A * 10/1998 Semenov et al. ........... 341/133
6,310,488 B1 * 10/2001 Hasegawa et al. ............. 326/6

OTHER PUBLICATIONS

F. Furuta, Y. Suzuki, E. Oya, S. Matsumoto, H. Akaike, A. Fujimaki, H. Hayakawa and Y. Takai, "New Logic Circuits Based on SFQ Signals", IEEE Transactions on Applied Superconductivity, vol. 9, No. 2, Jun. 1999, pp. 3553–3556.

* cited by examiner

*Primary Examiner*—Terry D. Cunningham
*Assistant Examiner*—Quan Tra

(57) ABSTRACT

The problem of the disclosed technology is as follows. Although a single flux quantum circuit can fabricate a high-speed sequential circuit with ease, the initialization of the circuit is required for guaranteeing the normal operation of the circuit. However, a prior-art circuit has no initializing function, or requires the restructuring of another logic system. For solving the foregoing problem, one Josephson junction is inserted to a flux quantum storage inductor constituting the existing logic circuit, so that a pulse for performing the circuit initialization is injected to the connection point by means of a comparator.

11 Claims, 14 Drawing Sheets

SUPERCONDUCTING SINGLE FLUX QUANTUM CIRCUIT

BACKGROUND OF THE INVENTION

The present invention relates to a single flux quantum circuit utilizing a single flux quantum as an information carrier.

The single flux quantum circuit is a logic circuit using a single flux quantum (below, abbreviated as an SFQ) as an information carrier. The SFQ can be handled as a voltage pulse with a pulse width of several picoseconds. Accordingly, it is possible to implement a not less than 100-GHz high-speed, high-throughput information processing circuit by an SFQ circuit. Further, since the state memory required of the logic circuit is implemented by storing SFQ due to the superconducting loop, it is possible to fabricate a sequential circuit with ease. Further, since the circuit is fabricated of a superconductor, it is possible to implement very low power consumption while maintaining the high speed performance. Up to now, there have been proposed a Josephson transmission line which is the most basic circuit, a basic circuit such as a data flip-flop, and medium scale circuits typified by an adder, a correlator, and the like.

In general, when information is processed by a sequential circuit, in order for the normal operation of the circuit to be guaranteed, setting of the internal state of the sequential circuit at the initial values, i.e., initialization is required. This is because the initial state of the circuit determines the circuit operation to be subsequently developed itself in the sequential circuit. However, in a prior art SFQ circuit, the initialization function has not been regarded as important, and hence it has not been given a sufficient consideration.

For example, a consideration will be given to a sequential circuit in which data flop-flops are connected in cascade. As schematically shown in the equivalent circuit of FIG. 1, in each of data flip-flops $DFF_1$ and $DFF_2$, the one end of a flux quantum storage inductor 305 is connected to an input terminal 307 via a Josephson junction 301, and grounded via a Josephson junction 302. The other end is connected to an output terminal 309, and connected to a clock pulse input terminal 308 via a Josephson junction 303, and further grounded via a Josephson junction 304. The output terminal 309 of the $DFF_1$, and the input terminal 307 of the $DFF_2$ are connected to each other.

The operation of the sequential circuit in accordance with the data flip-flops in FIG. 1 is as follows. Now, it is assumed that the $DFF_1$ and the $DFF_2$ are both in the initial states, i.e., no SFQ is stored in either of the flux quantum storage inductors 305. Therefore, it is assumed that the circulating currents $306_1$ and $306_2$ described later are not present in either of the flux quantum storage inductors $305_1$ and $305_2$. If an SFQ pulse is inputted to the input terminal $307_1$ of the $DFF_1$ as a data input in this state, the Josephson junction $302_1$ is switched to the voltage state, so that the circulating current $306_1$ flows to the flux quantum storage inductor $305_1$. Herein, the loop through which the circulating current flows is the loop of the flux quantum storage inductor $305_1$, the Josephson junction $304_1$, a grounded circuit, and the Josephson junction $302_1$. The flowing of the circulating current $306_1$ results in the data input to the input terminal $307_1$ being stored in the $DFF_1$. At this step, the voltage of the output terminal $309_1$ of the $DFF_1$ does not change. Therefore, the input terminal $307_2$ connected thereto is not affected at all. Then, when clock pulses are inputted from the respective clock pulse input terminals $308_1$ and $308_2$ of the $DFF_1$ and $DFF_2$, in the $DFF_1$, the current of the pulse and the circulating current $306_1$ previously described are superimposed one on another, so that the Josephson junction $304_1$ is switched to the voltage state. This operation cancels the circulating current $306_1$ to output the stored data from the output terminal $309_1$ as a voltage pulse. On the other hand, in the $DFF_2$, no circulating current $306_2$ is present. Therefore, the clock pulse inputted from the input terminal $308_2$ is prevented from entering due to the switching of the Josephson junction $303_2$ to the voltage state. Further, the voltage pulse outputted from the output terminal $309_1$ of the $DFF_1$ is added to the input terminal $307_2$ as a data input. Accordingly, the Josephson junction $302_2$ is switched to the voltage state, so that the circulating current $306_2$ flows to the flux quantum storage inductor $305_2$. Namely, the stored contents in the $DFF_1$ are transferred to the $DFF_2$, and stored therein. For adding another input to the $DFF_1$ as a data input, it is proper that an SFQ pulse is inputted to the input terminal $307_1$ as a data input after the completion of data transfer by the clock pulse.

Thus, the circulating current 306 of each data flip-flop DFF is canceled by the data transfer due to the clock pulse. This invariably involves the operation of emitting the stored data as a voltage pulse from the output terminal 309. Therefore, it is not possible to cancel the circulating current without emitting the pulse from the output terminal. Further, the emission of the voltage pulse results in the input to the data flip-flop DFF of the subsequent stage in the cascaded data flip-flops DFFs. Therefore, it is not possible to cancel the circulating currents of all the DFFs simultaneously by the data transfer due to the clock pulse for initialization.

Examples of the SFQ circuit given a consideration on the initialization function include the circuit referred to as a L-gate in IEEE., Transactions on Applied Superconductivity vol. 9, pp. 3553–3556, 1999. In FIG. 1 of the same literature, there is shown an example wherein a flip-flop circuit is fabricated of L-gates. Then, there is described a configuration method for implementing all the logic functions including the initialization function. However, the whole configuration of the circuit must be implemented as a combination of the L-gates when the initialization function is implemented by adopting the L-gates. For this reason, in the case where the portion requiring the initialization function is a part of the circuit, or other cases, several-fold elements have been necessary for implementing the same function as compared with a prior-art circuit.

SUMMARY OF THE INVENTION

It is an object of the present invention to initialize the internal state of a logic circuit having an SFQ storing function by adding a circulating current canceling circuit to only the portion of the circuit requiring the initializing function without requiring the restructuring of the circuit. Further, it is another object of the present invention to achieve the higher functions of a prior-art circuit, and further to implement a complicated logic circuit with less elements and a high margin by utilizing the characteristics resulting from the configuration of the circulating current canceling circuit.

As apparent from the description of FIG. 1, initializing is canceling of the circulating current flowing through a flux quantum storage inductor. In the present invention, therefore, the flux quantum storage inductor is divided into halves, and a Josephson junction is connected to the opened terminal of one inductor of the flux quantum storage inductor divided in halves. At the same time, a circulating current canceling circuit is inserted between the opened terminal of another inductor of the flux quantum storage inductor and a ground terminal. The circulating current canceling circuit is fabricated as follows. It automatically discriminates whether the circulating current is present or not in the flux quantum storage inductor in accordance with the application of an initializing pulse. Thus, it switches the Josephson junction for the division to the voltage state only when the circulating current is present, thereby to cancel the circulating current. It is so fabricated that the initializing pulse is naturally canceled when the circulating current is not present.

Further, by imparting a function of distributing input pulses, or other functions to a prior-art circuit by utilizing the characteristics resulting from the configuration of the circulating current canceling circuit, higher functions of the prior-art circuit is accomplished, and further, a complicated logic circuit is implemented with less elements, and with a high margin.

DESCRIPTION OF THE PREFERRED EMBODIMENTS

Below, the present invention will be described by way of examples. These examples are one examples, and not construed as limiting the scope of the present invention.

EXAMPLE 1

Figure 1:
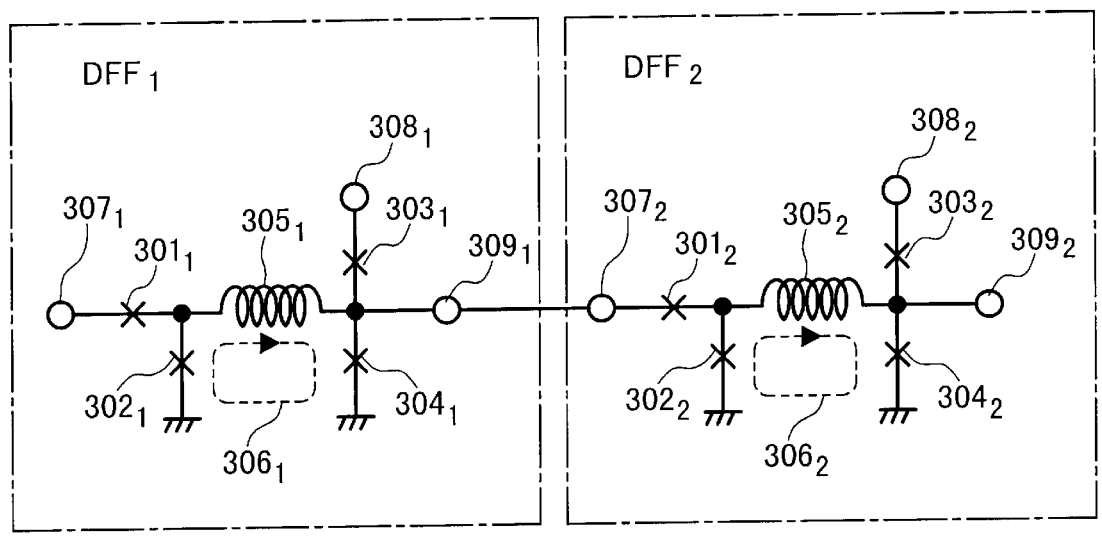
FIG. 1 is a diagram showing an example of a sequential circuit fabricated of a data flip-flop.
Figure 2:
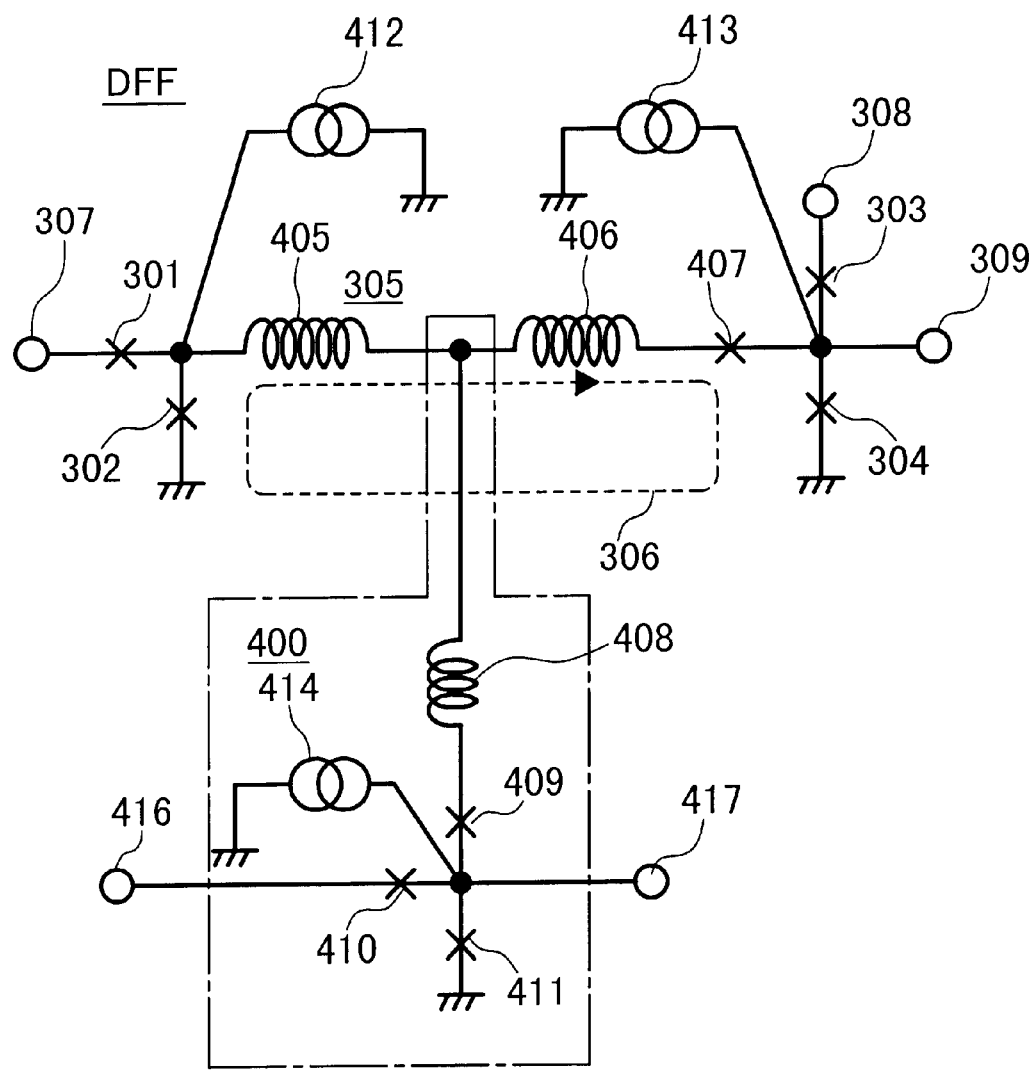
FIG. 2 is a diagram showing an equivalent circuit in a first example of the present invention.

There was implemented the initialization of a data flip-flop circuit to which an initialization function has been added by applying a circulating current canceling circuit proposed in the present invention to a data flip-flop. FIG. 2 shows an equivalent circuit as this example. In FIG. 2, only a data flip-flop $DFF_1$ in FIG. 1 is shown for simplification, and the identical reference numerals are given to the elements, which perform the equivalent operations with the elements described in FIG. 1. Further, bias current sources, the showing of which are omitted in FIG. 1, are shown. A bias current source 412 is connected to the connection point between Josephson junctions 301 and 302, and a bias current source 413 is connected to the connection point between Josephson junctions 303 and 304. A flux quantum storage inductor 305 in FIG. 1 is divided into tow parts of inductors 405 and 406, and a Josephson junction 407 is provided at the one end of the inductor 406. The circuit 400 connected to the connection point between the inductors 405 and 406 is the circulating current canceling circuit. For the circulating current canceling circuit, the one end of a Josephson junction 409 is connected to a Josephson junction 411, one end of which is grounded, and the other end of the Josephson junction 409 is connected to the connection point between the inductors 405 and 406 via an inductor 408. The connecting location of the Josephson junction 407 may be either side of the inductor 406. However, in this example, it was set to be the position closer to the Josephson junctions 303 and 304. To the connection point between the Josephson junction 409 and the Josephson junction 411, an initializing pulse input terminal is connected via a Josephson junction 410, and a bias current source 414 is connected. Further, to the connection point between the Josephson junction 409 and the Josephson junction 411, a terminal 417 is connected so as to allow monitoring, if required.

The operation of the data flip-flop DFF in FIG. 2 is the same as described for FIG. 1. However, the flux quantum storage inductor 305 is divided into two parts of the inductors 405 and 406, and the Josephson junction 407 is provided in series with the inductor 406. Accordingly, a circulating current 306 will flow through the Josephson junction 407. Now, it is assumed that an input is given to the input terminal 307 of the data flip-flop DFF, and that the circulating current 306 is flowing through the flux quantum storage inductor. In this state, in the example shown in FIG. 2, the circulating current also flows through the loop made up of the inductor 405, the inductor 408, the Josephson junction 409, the Josephson junction 411, and a grounded circuit.

In order to initialize the data flip-flop DFF with the circulating current 306 flowing, i.e., to cancel the circulating current in the flux quantum storage loop, an initializing pulse for initialization is inputted to an input terminal 416 of the circulating current canceling circuit 400. In this case, the Josephson junction 411 is switched to the voltage state, so that the initialing pulse propagates to the Josephson junction 407. This switches the Josephson junction 407 to the voltage state. As a result, the circulating current 306 is canceled. On the other hand, a consideration will be given to the case where the initializing pulse for initialization is inputted to the input terminal 416 of the circulating current canceling circuit 400 with no circulating current 306 flowing. In this case, as with the clock pulse inputted to the input terminal 308 of the data flip-flop DFF in which the circulating current 306 is not flowing, the initializing pulse is blocked from entering by the Josephson junction 410 switching to the voltage state.

When a clock pulse has been inputted to the input terminal 308 with the circulating current 306 flowing, the Josephson junction 304 is switched to the voltage state as described above. This attempts to cause the SFQ pulse to propagate toward the circulating current canceling circuit 400. However, the Josephson junction 409 is switched to the voltage state. Thus, switching of the Josephson junction 409 defends the circuit 400 from the affect of the propagating SFQ pulse.

Further, as apparent from the description on the operation of initialization with the circulating current 306 flowing, when the initialization has been carried out, the Josephson junction 411 of which the one end is grounded is switched to the voltage state. Therefore, upon monitoring the voltage of the terminal 417 connected to the connection point between the Josephson junction 409 and the Josephson junction 411, an SFQ pulse can be obtained at the terminal 417 according to the execution of the initialization. This can be used as a signal for determining whether the initialization has been executed, or not. Further, this can also be used as another signal.

EXAMPLE 2

Figure 3:
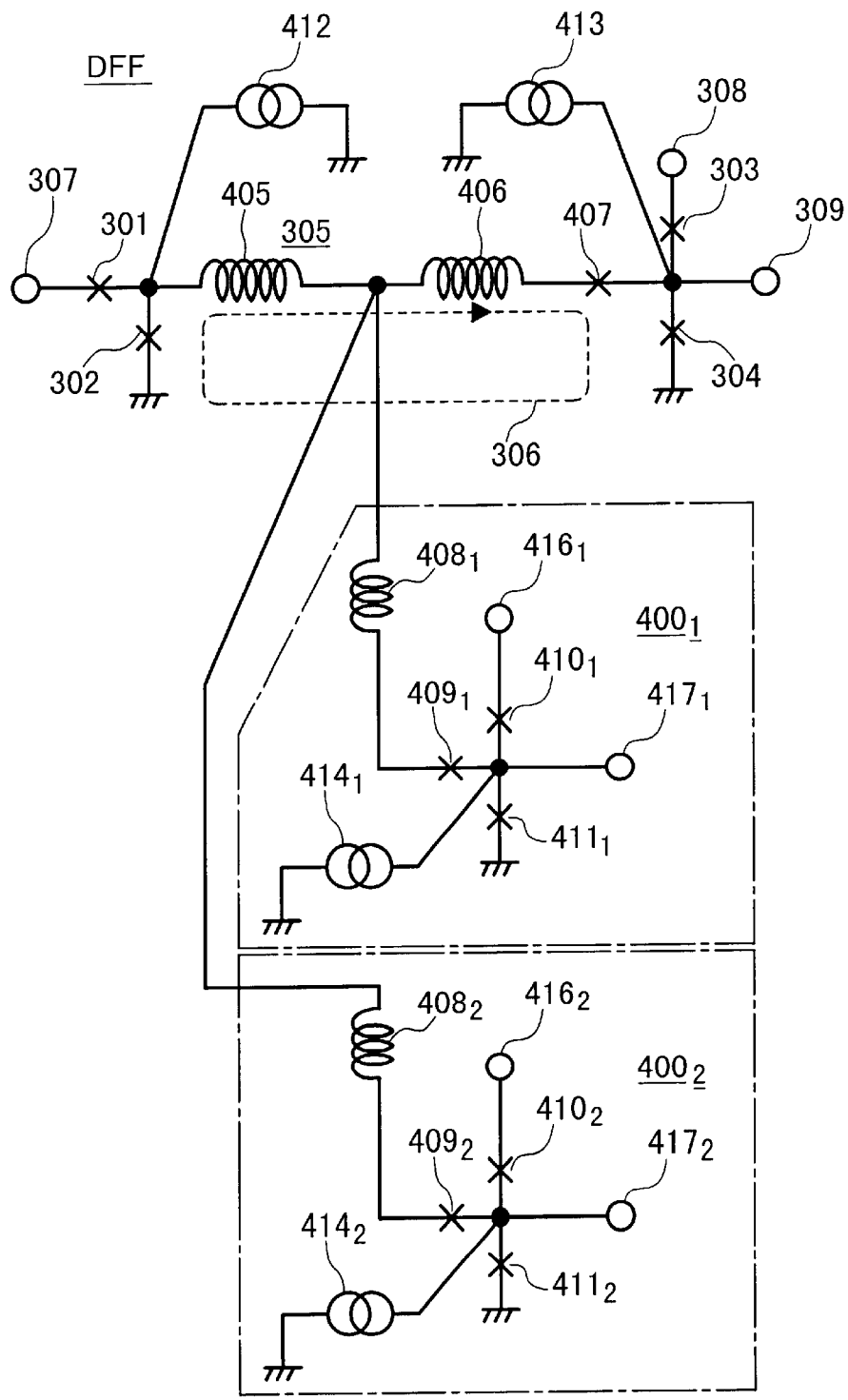
FIG. 3 is a diagram showing an equivalent circuit (1-to-n switching circuit) in a second example of the present invention.

FIG. 3 shows an example of a configuration obtained by implementing the configuration of a 1-to-n switching circuit of a second example of the present invention in a ratio of 1 to 3. Tables 1 and 2 show the values of the circuit parameters of FIG. 3.

TABLE 1

| Junction | 301 | 302 | 407 | 303 | 304 | 409 | 410 | 411 |
|---|---|---|---|---|---|---|---|---|
| Critical current value ($\mu$A) | 110 | 130 | 100 | 110 | 130 | 100 | 110 | 130 |

TABLE 2

| Inductor | 405 | 406 | 408 |
|---|---|---|---|
| Inductance (pH) | 7.0 | 4.1 | 4.1 |

In the circuit shown in FIG. 3, the identical reference numerals are given to the elements, which perform the equivalent operations with the elements described in FIG. 2. As easily understandable from the comparison between FIGS. 3 and 2, the circuit configuration of the example of FIG. 3 is the same as that of FIG. 2, and it can be said to have been merely changed in roles of elements. Further, in the example of FIG. 3, for the circulating current canceling circuit 400, there are disposed two circuits 400$_1$ and 400$_2$, which are identical in configuration with each other. The same numerical subscript is given to respective elements of each circuit.

In the circuit shown in FIG. 3, the configuration and the operation of the data flip-flop DFF are the same as those described in Example 1. When a pulse is inputted to the input terminal 307, this is stored in the form of the circulating current 306. When a pulse is inputted to the clock terminal 308, the circulating current 306 is canceled, and an output pulse is obtained at the output terminal 309. On the other hand, the circulating current canceling circuit 400 functions as a pulse switching circuit for one channel in this example. However, the function thereof is the same as that of the circulating current canceling circuit. Below, a description will be given in such a manner as to correspond to the description on the function of the 1-to-n switching circuit of this example, which is assumed to be the description on the pulse switching circuits 400$_1$ and 400$_2$. It can be said that the pulse switching circuit has been implemented by noticing the following fact. Namely, an SFQ pulse can be obtained according to the execution of initialization at the terminal 417 in response to the initializing pulse inputted to the terminal 416 of the circulating current canceling circuit of Example 1. This fact is utilized for the pulse switching input and switching output.

If the circulating current canceling circuit 400 of FIG. 2 is allowed to correspond to the pulse switching circuits 400$_1$ and 400$_2$ of FIG. 3, it is easily understandable that the input terminal 416, the Josephson junctions 409 and 410, and the bias current source 414 of the circulating current canceling circuit 400 are merely shown in a changed layout, and that the circuits are identical in circuit configuration with one another. In the pulse switching circuit 400, the input terminal 416 is set to be the input terminal for a clock pulse requiring output switching, and the terminal 417 is set to be an output terminal.

When a pulse is inputted to the clock pulse input terminal 416 of either of the pulse switching circuits 400$_1$ and 400$_2$ with the circulating current 306 of the data flip-flop DFF flowing, as with the operation of the circulating current canceling circuit, the circulating current 306 is canceled, and an output pulse is obtained at the output terminal 417. The inputting of a pulse to the input terminal 416 with no circulating current 306 flowing switches the Josephson junction 410 to the voltage state, which blocks the transfer of the pulse.

Figure 4:
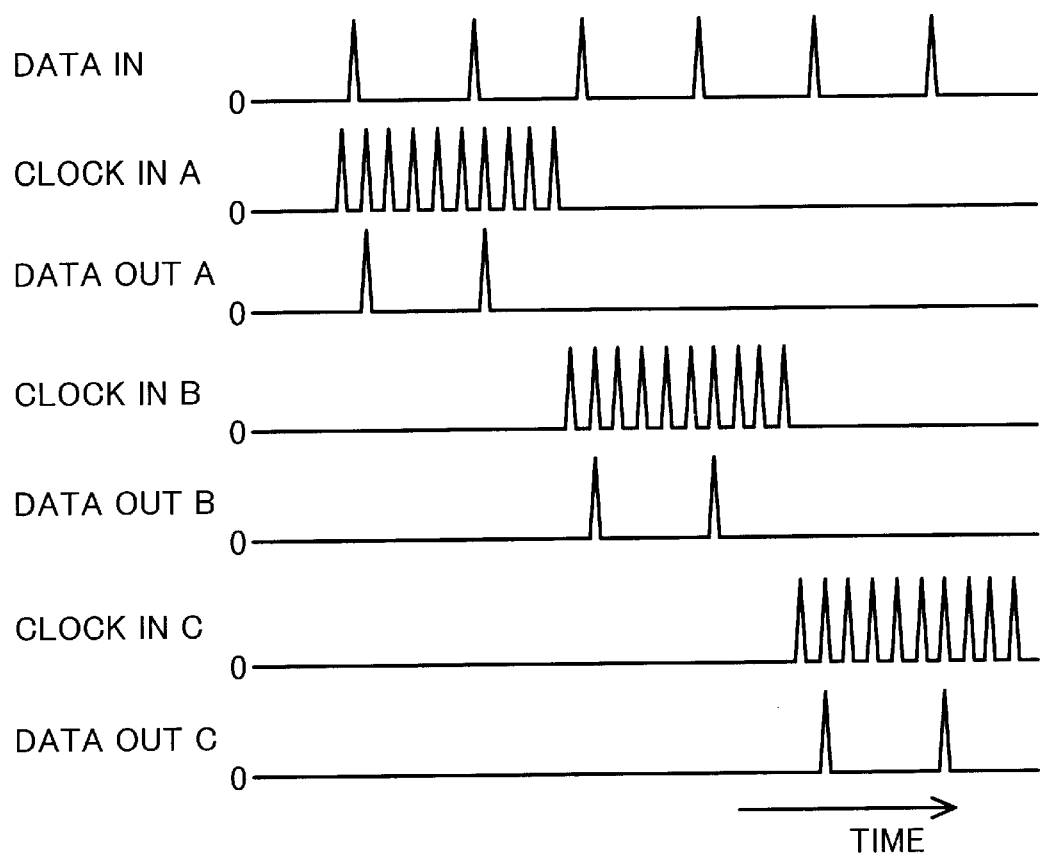
FIG. 4 is a diagram showing the operational waveforms of the second example of the present invention.

FIG. 4 is a diagram for illustrating the switching operation of a pulse of the switching circuit. Herein, the data input is a pulse to be inputted to the input terminal 307 of the data flip-flop DFF. Clock input A, clock input B, and clock input C are clock pulses to the terminals 308, 416$_1$, and 416$_2$, respectively. Data outputs A, B, and C are output pulses obtained at terminals 309, 417$_1$, and 417$_2$, respectively. The data inputs to be inputted to the input terminal 307 of the data flip-flop DFF are distributed to the terminal 309 as output pulses during the period in which the clock inputs A are being given to the terminal 308. These are switched and distributed to the terminal 417$_1$ as output pulses during the period in which the clock inputs B are being given to the terminal 416$_1$. Further, they are switched and distributed to the terminal 417$_2$ as output pulses during the period in which the clock inputs C are being given to the terminal 416$_2$. In any of the cases, the clock pulses are provided in a neglected manner after the pulse outputs have been produced in response to their respective data inputs.

Figure 5:
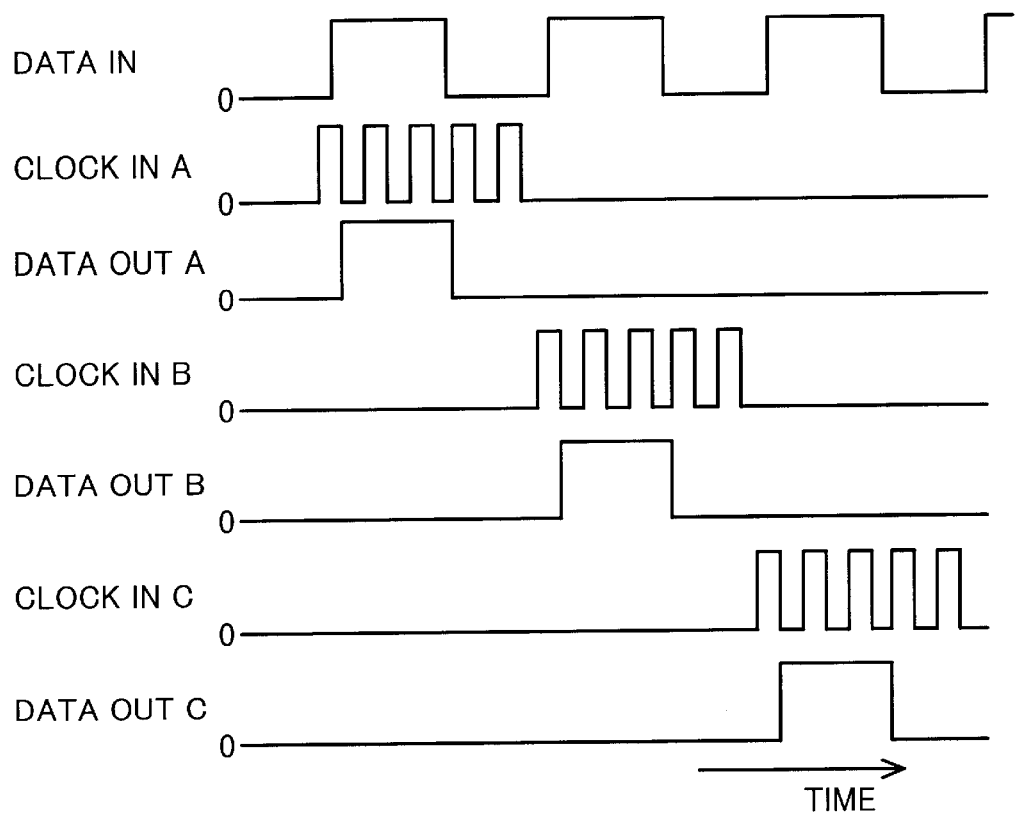
FIG. 5 is a diagram showing the observed waveforms of the second example of the present invention.

FIG. 5 shows an observation example of the operational waveforms of the circuit shown in FIG. 3 which performs the operation described in FIG. 4. Since the SFQ pulse has a voltage of several millivolts and a pulse width of several picoseconds, it cannot be directly measured by measuring instruments other than a special measuring instrument (Josephson sampler). For this reason, an SFQ/DC converter is used for observation of the pulses. The output voltage of the converter performs the inversion operation between the voltage stage of about 0.2 mV and the Zero-voltage state for every incoming of one input pulse. By observing the inversion operation, it is possible to determine the incoming of the SFQ pulse, i.e., the logic operation of the SFQ circuit in real time. As apparent from the comparison between FIGS. 4 and 5, the pulse waveform in FIG. 4 is observed in such a manner as to be switched to the voltage state in response to the first pulse, and to be switched to the Zero-voltage state in response to the subsequently incoming pulse. Also in FIG. 5, the data inputs are distributed in response to the clock inputs in the same manner as described for FIG. 4. Thus, it is possible to check the normal operation of the 1-to-3 switching circuit manufactured.

Figure 6:
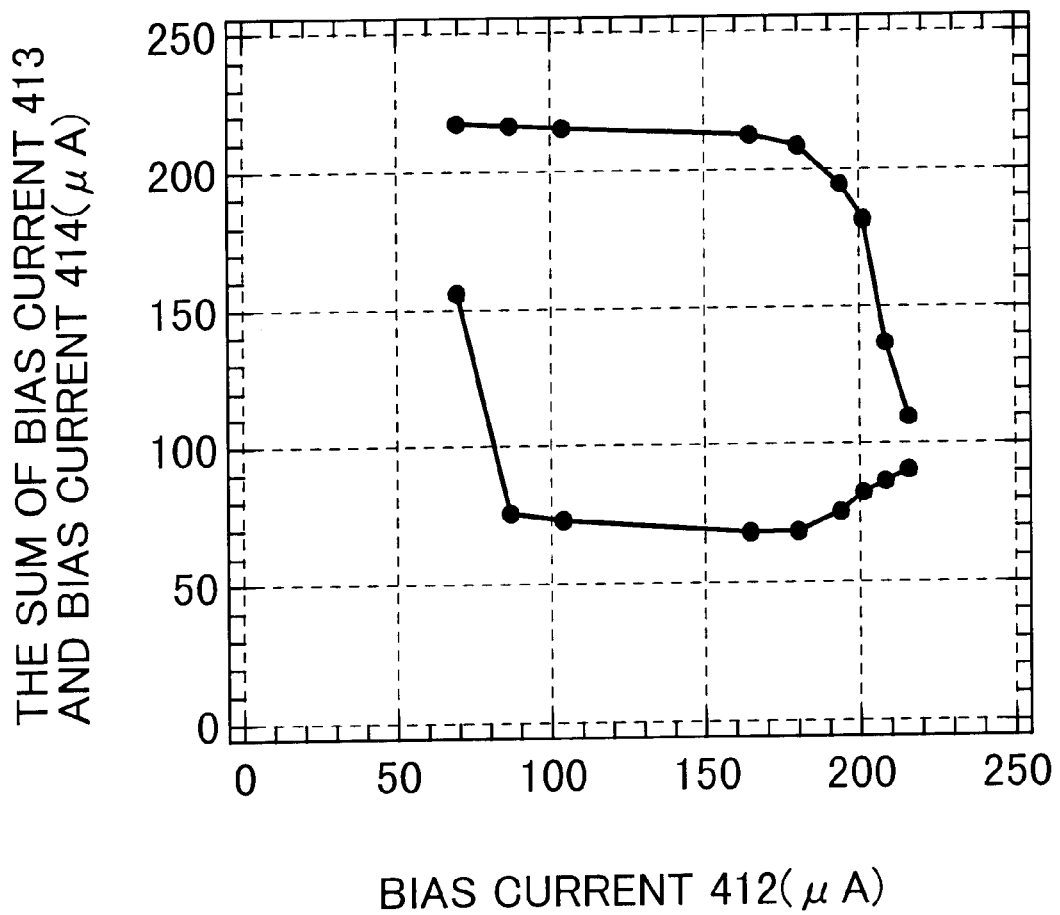
FIG. 6 is a graph showing the operation region with respect to the bias current of the second example of the present invention.

FIG. 6 is a graph showing the results of measurements of the bias current by fabricating a 1-to-2 switching circuit for evaluating the operation margin of the circuit. Namely, an evaluation was made on the bias current for allowing the stable operation of the 1-to-2 switching circuit made up of the data flip-flop DFF and the pulse switching circuit $400_1$ in FIG. 3. The current of the bias current source 412 is plotted as abscissa, and the sum of the current of the bias current source 413 and the current of a bias current source 414 as ordinate. The line in the form of an L at the lower part of the graph denotes the lower limit current at which the 1-to-2 switching circuit operates with stability, and the line in the form of an inverted L at the upper part denotes the upper limit current for the stable operation. As apparent from the graph, in this example, the stable operation is ensured at a current of the bias current source 412 in a range of from 90 $\mu$A to 180 $\mu$A. In this case, the lower limit current is 70 $\mu$A, and the upper limit current is 210 $\mu$A. Therefore, the margin of the circuit is determined in the following manner. The sum of the upper and lower limit currents (70+210) is divided by 2 to yield a value of 135. Whereas, the value of the lower limit current is subtracted from the value of the upper limit current to yield the value of (210−70)=140. Then, the division is performed wherein the calculated value of 135 is the denominator, and the calculated value of 140 is the numerator, yielding 1.04. This value is divided by 2, and expressed in percentage to yield ±52%, which is the margin. The bias margins of other switching circuits of this kind are generally from about ±30% to ±40% in ideal values. Therefore, it can be said that a sufficiently large margin have been able to be actually obtained in this invention. The feature of high margin largely contributes to the stable operation of the circuit upon implementation of higher integration of the circuit.

EXAMPLE 3

Figure 7:
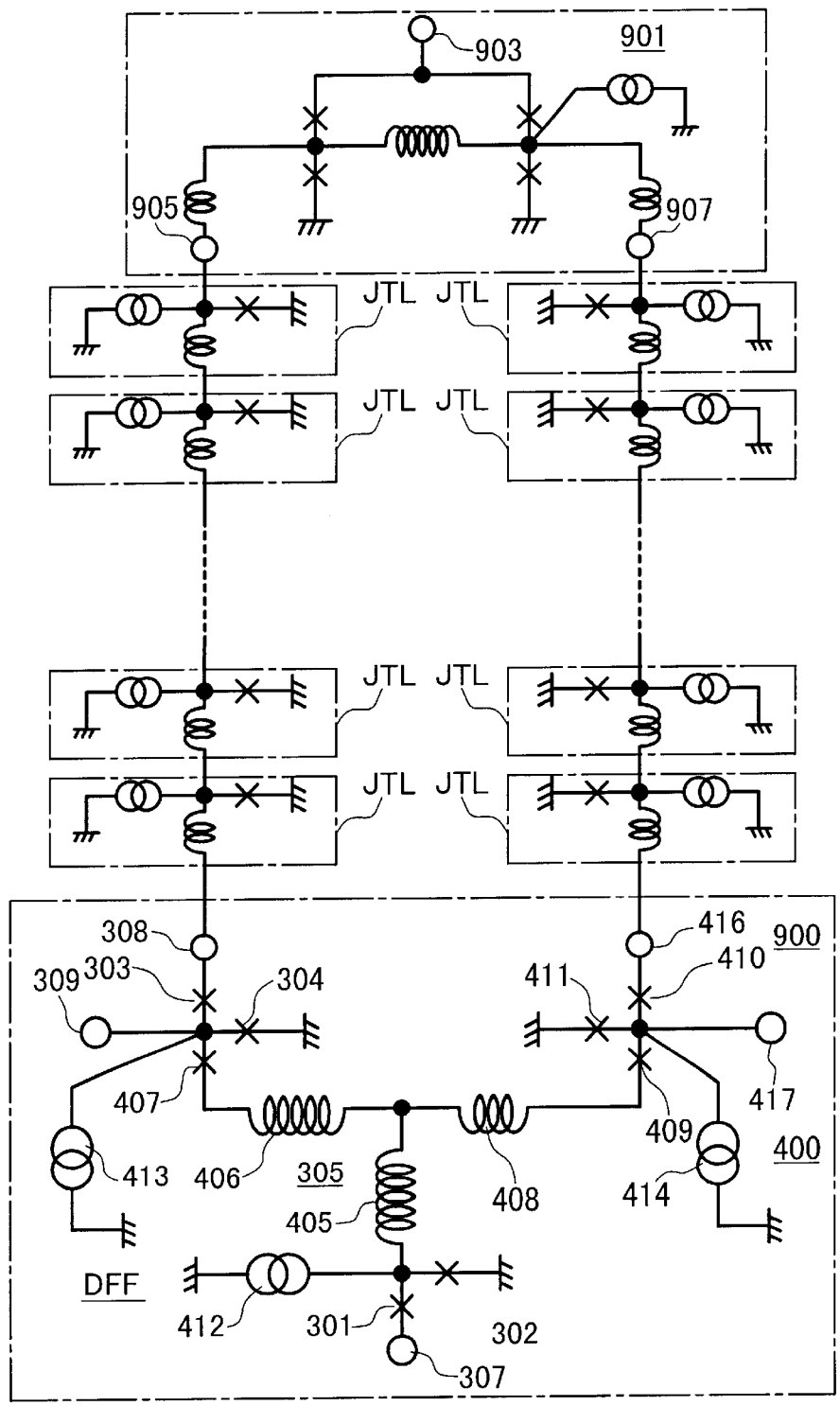
FIG. 7 is a diagram showing a configuration of a demultiplexer of a third example of the present invention.

FIG. 7 shows the circuit configuration of a 1-to-2 demultiplexer circuit including the switching circuit of Example 2 fabricated to be a 1-to-2 switching circuit, and so fabricated that the clock signals to be added to the clock input terminals 308 and 416 of the circuit are added in such a manner that one clock signal is distributed into two paths by an SFQ pulse distribution circuit 901. The 1-to-2 switching circuit is indicated by being surrounded by a dashed line as a block 900. As understandable from the comparison with FIG. 3, it is apparent that the circuit is made up of a data flip-flop DFF and a pulse switching circuit 400. Herein, the identical reference numerals are given to the elements having the same functions as the circuit elements in FIG. 3. Further, the circuit parameters of the 1-to-2 switching circuit 900 are the same as those shown in Tables 1 and 2 previously described.

For the pulse distribution circuit, a toggle flip-flop circuit, which is a typical known circuit of the SFQ logic circuits, was used. As is well known, the toggle flip-flop circuit (below, abbreviated as T-FF) 901 is made up of four Josephson junctions and three inductors, so that clock pulses inputted to an input terminal 903 are outputted in such a manner as to be alternately distributed to output terminals 905 and 907. The clock pulses outputted in such a manner as to be alternately distributed to the output terminals 905 and 907 are added to the clock input terminals 308 and 416 of the 1-to-2 switching circuit 900 via a series circuit of Josephson transmission lines JTLs each made up of one Josephson junction and one inductor. Therefore, the clock pulses appear to be ½ frequency-divided and added to respective input circuits as seen from the 1-to-2 switching circuit 900. Then, the signal added to the input terminal 307 of the 1-to-2 switching circuit 900 is distributed to the output terminals 309 and 417 in response to the clock pulses to be outputted.

Figure 8:
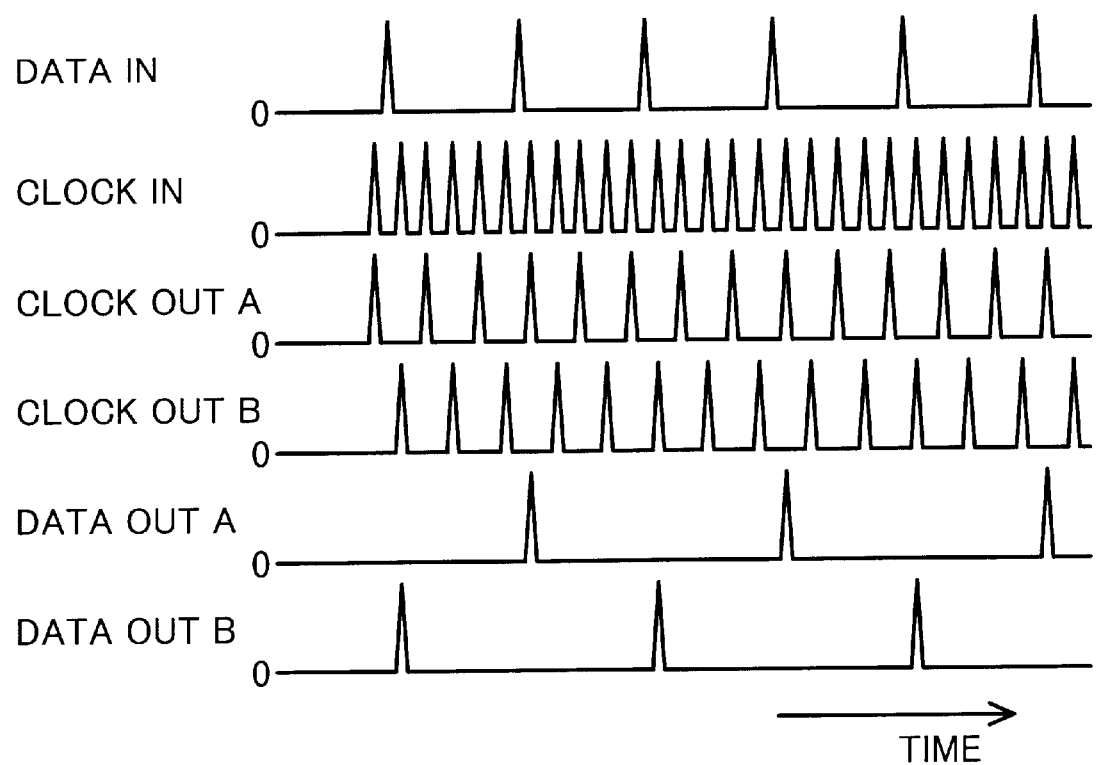
FIG. 8 is a diagram showing the operational waveforms of a third example of the present invention.

FIG. 8 is a diagram for illustrating the operational waveforms of the 1-to-2 demultiplexer circuit shown in FIG. 7. The data input is the pulse to be added to the input terminal 307. The clock input is the clock pulse to be inputted to the input terminal 903 of the T-FF. Clock outputs A and B are clock pulses obtained at the output terminals 905 and 907 of the T-FF, respectively. The series circuit of the Josephson transmission lines JTLs only sharpens and propagates the clock pulses as its function, and hence the showing thereof is omitted in FIG. 8. The clock pulses propagated through the Josephson transmission lines JTLs are added to the clock input terminals 308 and 416 of the 1-to-2 switching circuit 900, respectively, so that the signal added to the data input terminal 307 of the 1-to-2 switching circuit 900 is distributed to the output terminals 309 and 417.

Figure 9:
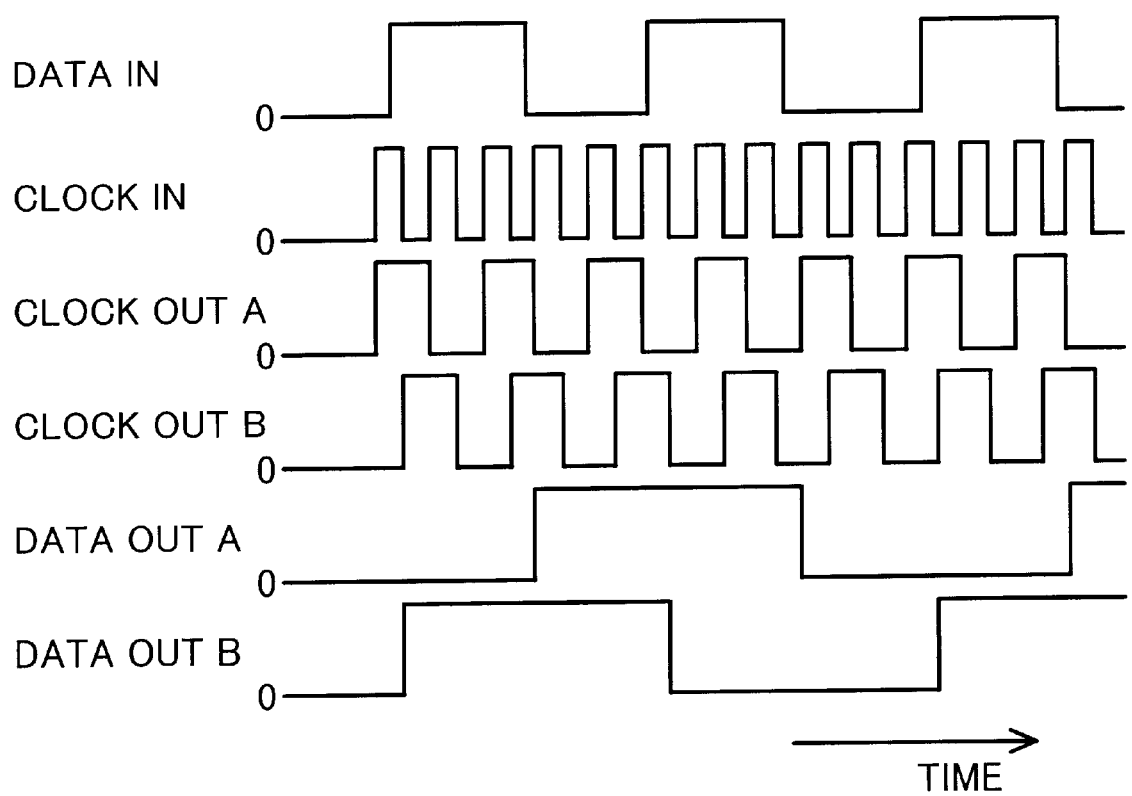
FIG. 9 is a diagram showing the observed waveforms of the third example of the present invention.

As with FIG. 5, FIG. 9 shows an observation example of the operational waveforms of the circuit shown in FIG. 7 which performs the operation described in FIG. 8.

EXAMPLE 4

Figure 10:
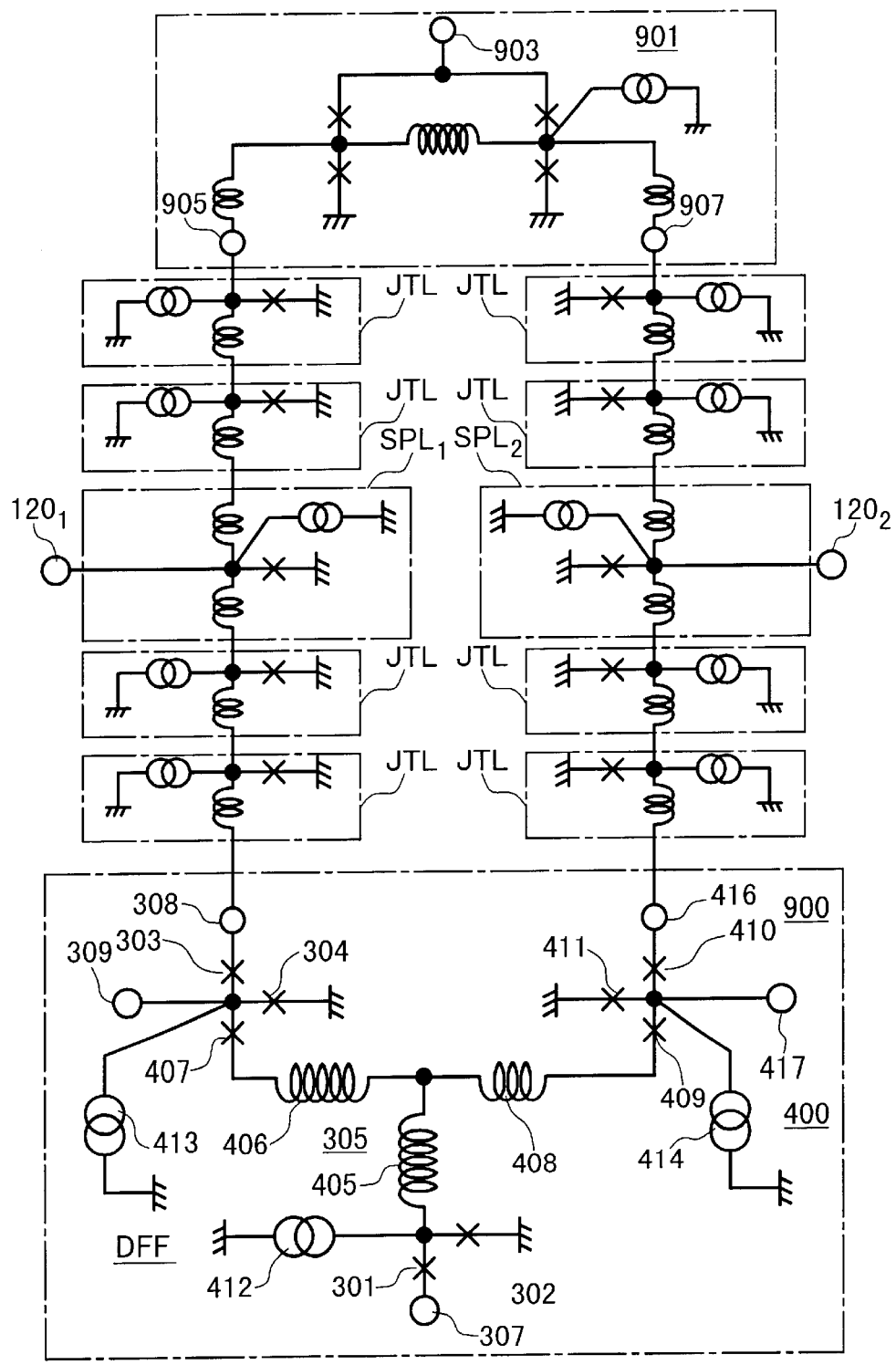
FIG. 10 is a diagram showing a configuration of a demultiplexer circuit of an intermediate clock pulse output type of the fourth example of the present invention.

FIG. 10 shows the circuit configuration of a 1-to-2 demultiplexer circuit basically identical in configuration with the 1-to-2 demultiplexer circuit described in FIG. 7. As apparent from the comparison with FIG. 7, this circuit is, however, pulse branch circuits $SPL_1$ and $SPL_2$ are inserted in their respective intermediate positions of the series circuits of the Josephson transmission lines JTLs. Therefore, the clock pulses obtained at the output terminals 905 and 907 of the T-FF are transmitted to the 1-to-2 switching circuit 900, and also outputted to respective output terminals $120_1$ and $120_2$ of the pulse branch circuits $SPL_1$ and $SPL_2$. Namely, this circuit can be said to be the 1-to-2 demultiplexer circuit of an intermediate clock pulse output type.

As for the operation of this circuit, there are provided the same operational waveforms and the observation example of the operational waveforms as those shown in FIGS. 8 and 9, except that a clock pulse A output and a clock pulse B output are obtained also at the output terminals $120_1$ and $120_2$ of the pulse branch circuits $SPL_1$ and $SPL_2$. Therefore, the showing thereof is omitted.

Further, also in this example, the circuit parameters of the 1-to-2 switching circuit 900 are the same as those shown in Tables 1 and 2 previously described. Also for the operation margin, ±50% is obtained for the bias, which can implement the stable operation almost no different from the operation ensured by the value for the 1-to-2 switching circuit alone.

EXAMPLE 5

Figure 11:
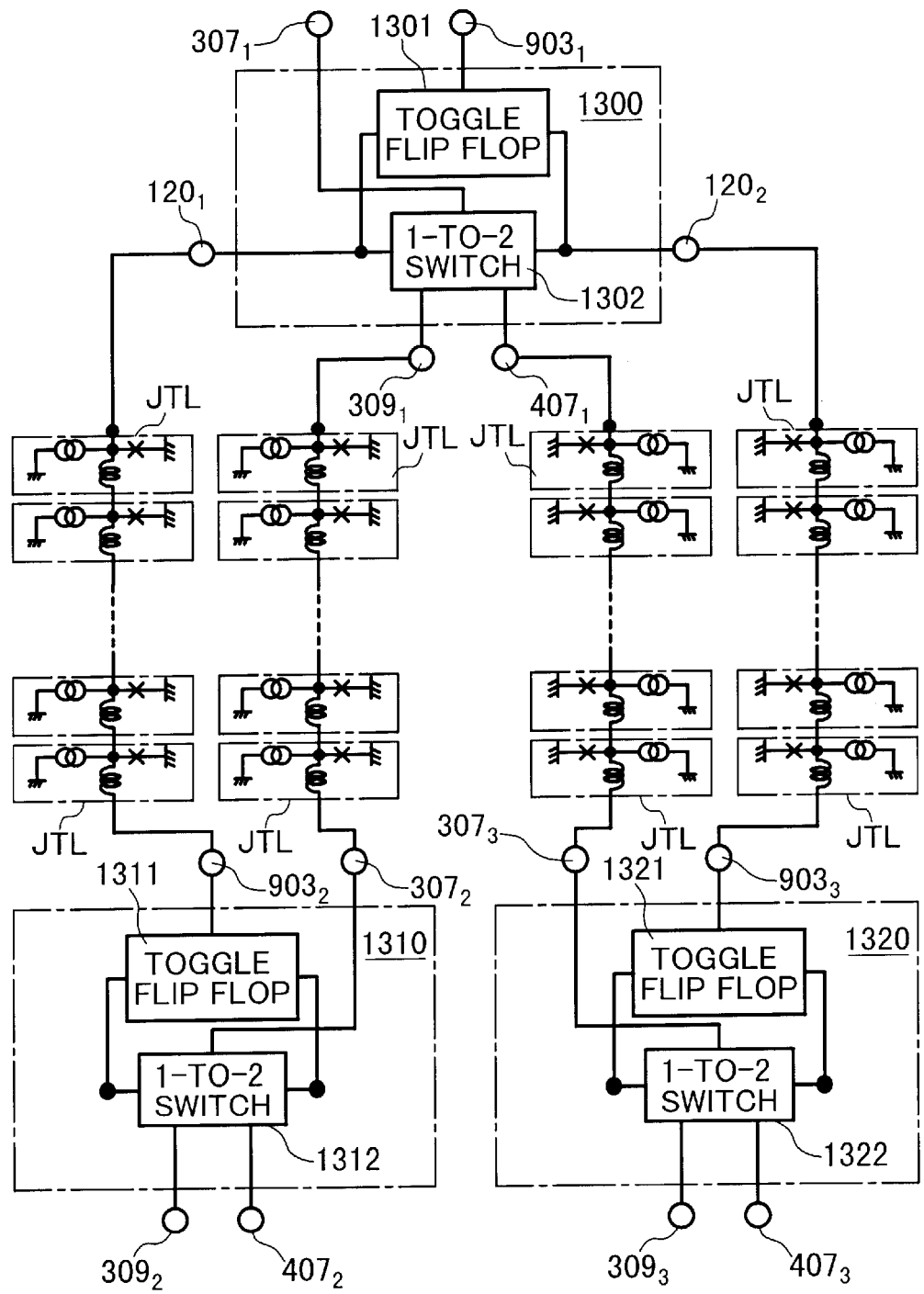
FIG. 11 is a diagram showing a configuration of a 1-to-4 demultiplexer circuit of a fifth example of the present invention.

FIG. 11 is a diagram showing the circuit configuration of a configuration of a 1-to-4 demultiplexer circuit applying the 1-to-2 demultiplexer circuit of an intermediate clock pulse output type described in FIG. 10. In the diagram, a reference numeral 1300 denotes a 1-to-2 demultiplexer circuit, and made up of an SFQ circuit 1301 and a 1-to-2 switching circuit 1302. The SFQ circuit 1301 is a circuit made up of the T-FF 901 and series circuits of Josephson transmission lines JTLs in which the pulse branch circuits $SPL_1$ and $SPL_2$ are inserted at their respective intermediate positions described for FIG. 10. The 1-to-2 switching circuit 1302 is the same as the 1-to-2 switching circuit 900 described for FIG. 10. In the SFQ circuit 1301, a clock input terminal $903_1$ is provided. In the 1-to-2 switching circuit 1302, the input terminal $307_1$ is provided. Further, output terminals $120_1$ and $120_2$ are withdrawn from the pulse branch circuit SPL of the SFQ circuit 1301, and output terminals $309_1$ and $407_1$ are withdrawn from the 1-to-2 switching circuit 1302. The 1-to-2 demultiplexer circuit 1300 is so fabricated that the signal inputted to the input terminal $307_1$ is distributed to the output terminals $309_1$ and $407_1$ in response to the clocks inputted to the clock input terminal $903_1$ as easily understandable from the correspondences in reference numerals and characters with the 1-to-2 demultiplexer circuit of an intermediate clock pulse output type shown in FIG. 10.

The output pulses distributed to the output terminals $309_1$ and $407_1$ and the clock pulses extracted from the output terminals $120_1$ and $120_2$ of the pulse branch circuit SPL are respectively introduced to 1-to-2 demultiplexer circuits 1310 and 1320 via the series circuits of the Josephson transmission lines JTLs. These $_1$-to-2 demultiplexer circuits 1310 and 1320 are also made up of SFQ circuits 1311 and 1321, and 1-to-2 switching circuits 1312 and 1322, respectively as with the 1-to-2 demultiplexer circuit 1300. In this case, the output pulses from the 1-to-2 switching circuit 1302 are added to the respective input terminals $307_2$ and $307_3$ of the 1-to-2 switching circuits 1312 and 1322. The clock pulses extracted from the output terminals $120_1$ and $120_2$ of the pulse branch circuit SPL are added to the clock input terminals $903_2$ and $903_3$ of the SFQ circuits 1311 and 1321, respectively.

Figure 12:
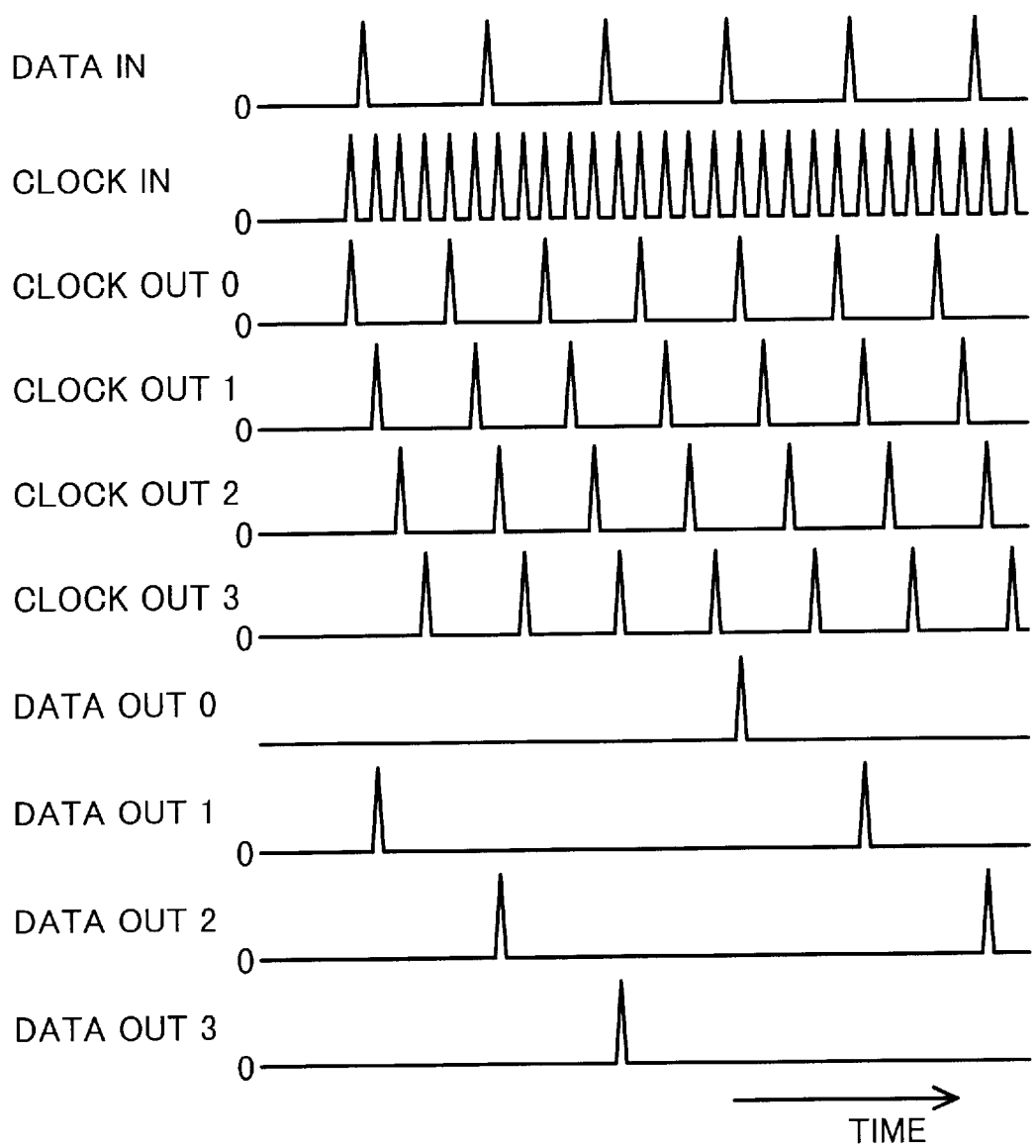
FIG. 12 is a diagram showing the operational waveforms of the fifth example of the present invention.
Figure 13:
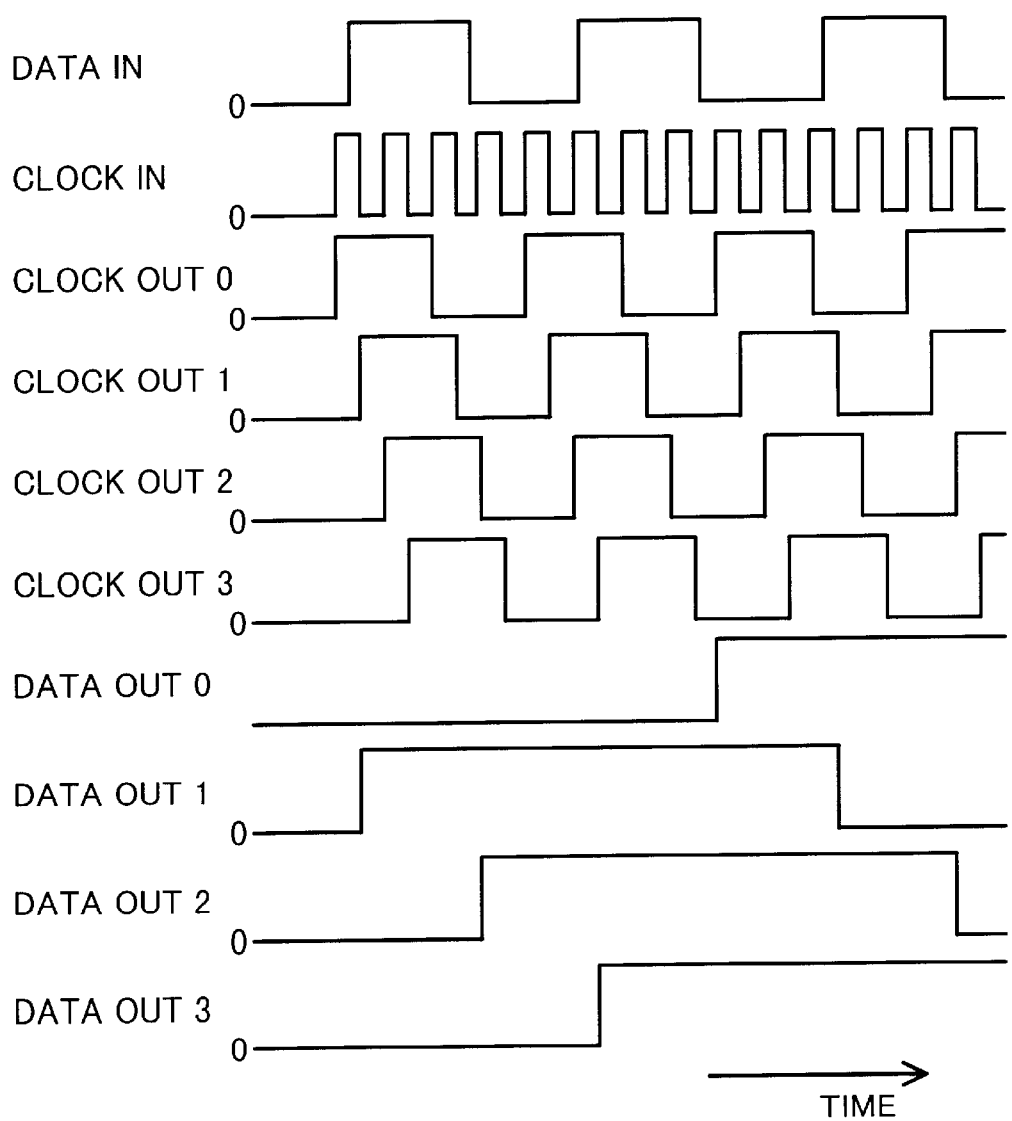
FIG. 13 is a diagram showing the observed waveforms of the fifth example of the present invention.

FIG. 12 shows the operational waveforms, and FIG. 13 shows an example of the observed waveforms. Also herein, the presence of the series circuits of the Josephson transmission lines JTLs are neglected.

As apparent from reference to the operational waveforms of the 1-to-4 demultiplexer shown in FIG. 12, the final output channels correspond to four channels, and they are respectively referred to as 0, 1, 2, and 3 channels. The data to the demultiplexer is inputted in synchronism with the clock input. The input rate of data to clock is 1 to 5. The original input clock pulses have been thinned out so that every four clock pulses are retained by the operation of the T-FF, and the waveform of each clock output is expressed as a quarter of the original input clock. The timing of pulse of data output 0 is in agreement therewith. The timing of change of data outputs 1, 2, and 3 delay with respect to the clock output 0 by ¼ of the period, 2/4 of the period, and ¾ of the period, respectively. This indicates that the data distribution to data output 1, data output 2, and data output 3 is carried out at a proper timing. As with FIG. 5, FIG. 13 shows an observation example of the operational waveforms of the circuit shown in FIG. 11 which performs the operation described in FIG. 12.

It has been found that the margin with respect to the bias current of the 1-to-2 switching circuit constituting the 1-to-4 demultiplexer circuit has almost the same magnitude as with the circuit alone. This means that the margin of the 1-to-2 switching circuit does not depend upon the circuit scale, and indicates that the shift to multichannel of the demultiplexer is easy. Further, as apparent from the configuration of the figure, this example shows such a configuration that the 1-to-2 demultiplexers of the identical configuration are arranged in mirror symmetry. Therefore, its circuit layout is easy, so that it is possible to obtain a high reliability configuration.

EXAMPLE 6

Figure 14:
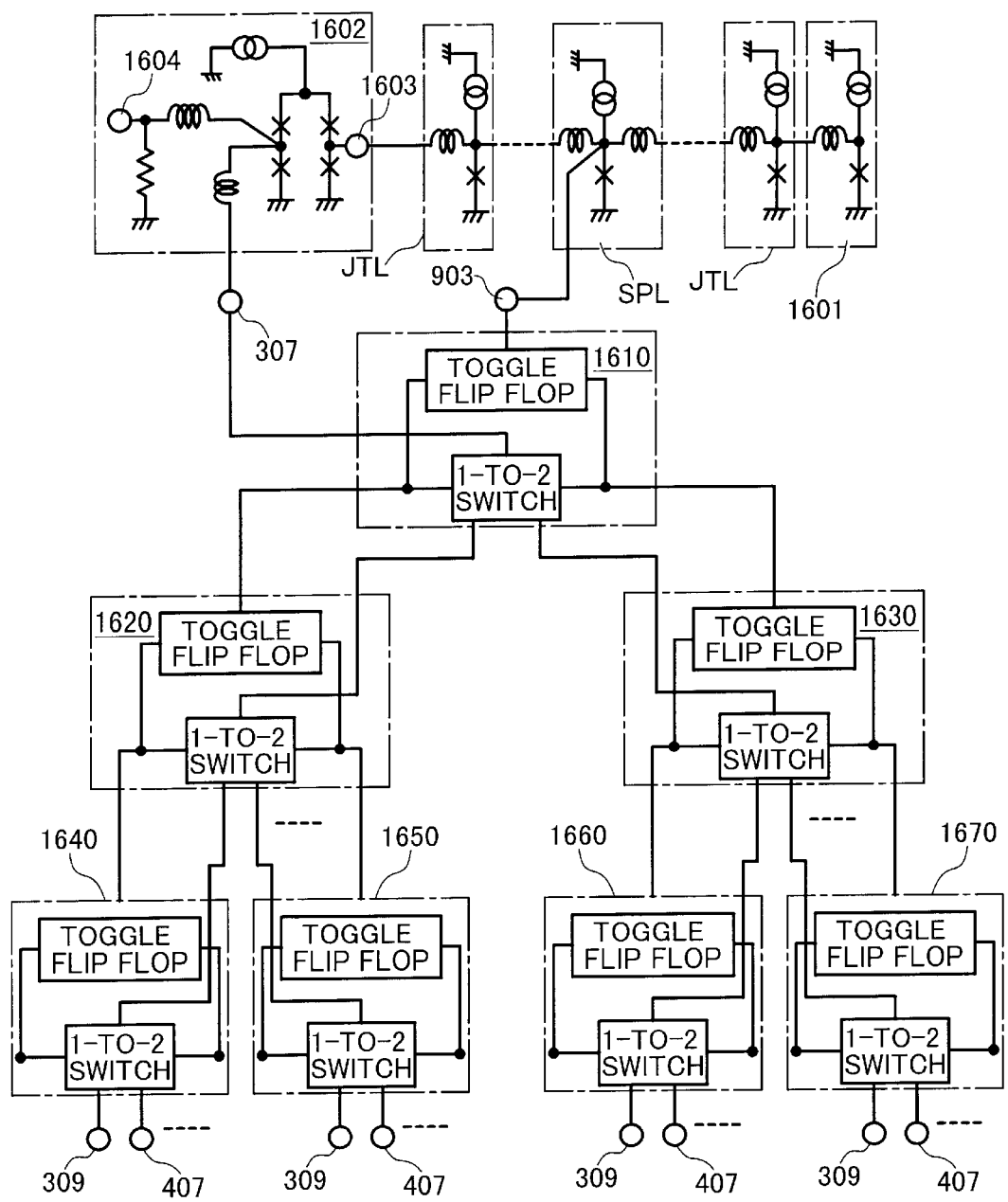
FIG. 14 is a diagram showing a configuration of an analog/digital converter of a sixth example of the present invention.

FIG. 14 shows an example of a digital converter in which an output from a ΣΔ modulator is introduced into the data of a 1-to-8 demultiplexer as an application circuit of a 1-to-n demultiplexer. A clock signal generated from a clock oscillator 1601 is added to a clock input terminal 1603 of a ΣΔ modulator 1602 via a series circuit of Josephson transmission lines JTLs having a branch circuit SPL at its intermediate position. The ΣΔ modulator 1602 outputs a data pulse having a density according to the magnitude of an externally input voltage connected to an input terminal 1604 in synchronism with the clock signal. This data pulse is added to an input terminal 307 of a 1-to-2 demultiplexer 1610. On the other hand, the clock signal branched at the branch circuit SPL is inputted to a clock input terminal 903 of the 1-to-2 demultiplexer 1610. The pulses obtained from the 1-to-2 demultiplexer 1610 are added to 1-to-2 demultiplexers 1620 and 1630 of the subsequent stage. The pulses resulting therefrom are added to 1-to-2 demultiplexers 1640 to 1670 of the subsequent stage. After all, in this example, the data is temporally divided into outputs of 8 channels. The output data from the modulator, whose rate is as high as several tens of Gbit/s, and hence which has been difficult to extract to the outside, is divided into multichannels. Thus, it is possible to reduce the data rates in respective channels. Namely, it becomes possible to extract the output data from the ΣΔ modulator to circuits which fabricate semiconductor devices.

Incidentally, in FIG. 14, the showing of the series circuits of the Josephson transmission lines JTLs connecting between the 1-to-2 demultiplexers of respective stages is omitted due to the restriction on the size of the drawing. Further, as apparent from the configuration of the drawing, this example shows such a configuration that the 1-to-2 demultiplexers of the identical configuration are arranged in mirror symmetry. Therefore, its circuit layout is easy, so that it is possible to obtain a high reliability configuration.

By a combination of a sequential circuit of such a type that data is stored depending upon whether the circulating current is being stored or not, and a canceling circuit of the circulating current thereof, the initialization of the sequential circuit is accomplished in such a manner as to be due to the operation of the circulating current canceling circuit. In addition, this configuration is used for the circuit functioning as a 1-to-2 switching circuit, which allows a multichannel demultiplexer to be fabricated with ease.

What is claimed is:

1. A superconducting single flux quantum circuit, comprising:

a signal storing circuit, comprising: a first inductor; Josephson junctions connected to opposite ends of the first inductor, for forming a loop through which a circulating current flows between the first inductor and a grounded circuit; a signal input terminal connected to the one end of the first inductor via a Josephson junction, for inputting a single flux quantum pulse; and a clock input terminal connected to the other end of the first inductor via a Josephson junction, for inputting a clock pulse, the circulating current being caused to flow through the first inductor by the single flux quantum pulse inputted to the signal input terminal, the circulating current of the first inductor being interrupted by the clock pulse inputted to the clock input terminal during the flow of the circulating current, and a single flux quantum pulse being outputted from an output terminal withdrawn from a connection point of the clock input terminal and the first inductor; and a circulating current canceling circuit, comprising: a second inductor connected to a position to divide the fist inductor into roughly equal halves; series-connected two Josephson junctions for grounding the other end of the second inductor; a bias current source connected to a connection point between the series-connected two Josephson junctions, for supplying a bias current; an initializing pulse input terminal connected via a Josephson junction connected to the connection point between the series-connected two Josephson junctions, for inputting an initializing pulse; and an output terminal for outputting the state of the connection point between the series-connected two Josephson junctions, and, a Josephson junction being inserted in series to the one end of the inductor closer to the clock input terminal of the first inductor divided into halves.

2. The superconducting single flux quantum circuit according to claim 1, comprising a plurality of circulating current canceling circuits each of which comprises: a second inductor connected to a position to divide the fist inductor into roughly equal halves; series-connected two Josephson junctions for grounding the other end of the second inductor; an initializing pulse input terminal connected to the connection point between the series-connected two Josephson junctions via a Josephson junction, for inputting an initializing pulse; and an output terminal for outputting the state of the connection point between the series-connected two Josephson junctions.

3. The superconducting single flux quantum circuit according to claim 1, being fabricated to be a 1-to-2 switching circuit whereby the successive clock pulses are alternately distributed to generate two successive clock pulses by a toggle flip-flop, one of the clock pulses is added to the clock input terminal of the signal storing circuit, and the other one of the clock pulses is added to the initializing pulse input terminal of the circulating current canceling circuit, so that the single flux quantum pulses inputted to the signal input terminal of the signal storing circuit are distributed to the output terminal of the signal storing circuit and the output terminal of the circulating current canceling circuit in response to the clock pulses outputted from the toggle flip-flop.

4. The superconducting single flux quantum circuit according to claim 3, wherein transmissions of the clock pulses obtained from the toggle flip-flop circuit to the signal storing circuit and the circulating current canceling circuit are accomplished respectively by circuits of a plurality of series-connected Josephson transmission lines.

5. The superconducting single flux quantum circuit according to claim 4, wherein transmissions of the clock pulses to the signal storing circuit and the circulating current canceling circuit are accomplished respectively by circuits of a plurality of series-connected Josephson transmission lines, and a pulse branch circuit is inserted in each midpoint of the circuits each composed of series connection, so that clock pulses in synchronism with the clock pulses to be transmitted to the signal storing circuit and the circulating current canceling circuit are obtainable.

6. The superconducting single flux quantum circuit according to claim 1, fabricated to be a 1-to-4 demultiplexer circuit, comprising:

a 1-to-2 switching circuit of a first stage whereby successive first clock pulses are alternately distributed to generate two successive second clock pulses, one of them is added to the clock input terminal of the signal storing circuit, and the other one of the clock pulses is added to the initializing pulse input terminal of the circulating current canceling circuit, so that the single flux quantum pulses inputted to the signal input terminal of the signal storing circuit are distributed to the output terminal of the signal storing circuit and the output terminal of the circulating current canceling circuit in response to the first clock pulses; and two 1-to-2 switching circuits of a second stage, each whereby successive third clock pulses are alternately distributed to generate two successive fourth clock pulses, one of them is added to the clock input terminal of the signal storing circuit, and the other one of the clock pulses is added to the initializing pulse input terminal of the circulating current canceling circuit, so that the single flux quantum pulses inputted to the signal input terminal of the signal storing circuit are distributed to the output terminal of the signal storing circuit and the output terminal of the circulating current canceling circuit in response to the third clock pulses;

the respective third clock pulses of the 1-to-2 switching circuits of the second stage having been branched from the second clock pulses, and the single flux quantum pulses to be inputted to the respective signal input terminals of the signal storing circuits of the second stage being the outputs from the 1-to-2 switching circuit of the first stage.

7. The superconducting single flux quantum circuit according to claim 6, wherein the transmissions of the clock pulses and the outputs which will be the input signals to the subsequent stage between the 1-to-2 switching circuit of the first stage and the 1-to-2 switching circuits of the second stage are respectively accomplished through circuits each composed of a plurality of series-connected Josephson transmission lines.

8. The superconducting single flux quantum circuit according to claim 7, wherein the transmissions of the clock pulses to the signal storing circuit and the circulating current canceling circuit are accomplished respectively by circuits of a plurality of series-connected Josephson transmission lines, and a pulse branch circuit is inserted in each midpoint of the circuits each composed of series connection, so that clock pulses in synchronism with the clock pulses to be transmitted to the signal storing circuit and the circulating current canceling circuit are obtainable.

9. The superconducting single flux quantum circuit according to claim 1, comprising: a clock pulse generation circuit; a series circuit of Josephson transmission lines including a circuit for transmitting a clock pulse from the clock pulse generation circuit, and branching it at its midpoint; and a $\Sigma\Delta$ modulator for outputting a data pulse having a density according to the magnitude of an input voltage in synchronism with a clock signal obtained from the series circuit, and comprising: a 1-to-2 switching circuit whereby the clock pulse obtained from the branch circuit is distributed into two clock pulses, and one of them is added to the clock input terminal of the signal storing circuit, and the other one of the clock pulses is added to the initializing pulse input terminal of the circulating current canceling circuit, so that the single flux quantum pulses inputted to the signal input terminal of the signal storing circuit, which are the outputs from the $\Sigma\Delta$ modulator, are distributed to the output terminal of the signal storing circuit and the output terminal of the circulating current canceling circuit in response to the clock pulses distributed to two terminals.

10. The superconducting single flux quantum circuit according to claim 9, wherein the 1-to-2 switching circuit is set to be a 1-to-2 switching circuit of a first stage, and the 1-to-2 switching circuits of a plurality of stages are arranged for second and subsequent stages.

11. A superconducting single flux quantum circuit, comprising: a circuit configuration constructed of series-connected first and second Josephson junctions; series-connected third and fourth Josephson junctions; a data input terminal attached to the one end of the first Josephson junction; a first clock input terminal attached to the one end of the third Josephson junction; a first data output terminal for producing an output at the connection point between the third and fourth Josephson junctions; a first bias current source for supplying a current to the connection point between the first and second Josephson junctions and a second bias current source for supplying a current to the connection point between the third and fourth Josephson junctions, of which the terminals on the different side from the respective connection points with the second and fourth Josephson junctions are respectively grounded; a first inductor connected to the connection point between the first and second Josephson junctions; a fifth Josephson junction connected to the connection point between the third and fourth Josephson junctions; a second inductor connected between the other end of the first inductor and the other end of the fifth Josephson junction;

a sixth Josephson junction of which the one end is grounded; a seventh Josephson junction connected to the other end of the sixth Josephson junction; an eighth Josephson junction connected to the other end of the sixth Josephson junction; a third bias current source connected to the other end of the sixth Josephson junction; a second data output terminal connected to the other end of the sixth Josephson junction; a second clock input terminal disposed on the other end of the eighth Josephson junction; and a third inductor connected to the other end of the seventh Josephson junction, the side of the third inductor different from the side connected to the seventh Josephson junction being connected to the connection point between the first inductor and the second inductor, such that a signal inputted from the data input terminal is outputted to either of the fist data output terminal and the second data output terminal in response to the input of a signal from the first clock input terminal or the second clock input terminal.

* * * * *